United States Patent [19]

Duvvury et al.

[11] Patent Number: 4,855,620
[45] Date of Patent: Aug. 8, 1989

[54] OUTPUT BUFFER WITH IMPROVED ESD PROTECTION

[75] Inventors: Charvaka Duvvury, Missouri City; Robert N. Rountree, Richmond, both of Tex.

[73] Assignee: Texas Instruments Incorporated, Dallas, Tex.

[21] Appl. No.: 122,300

[22] Filed: Nov. 18, 1987

[51] Int. Cl.[4] .......................... H03K 5/00; H02H 3/24
[52] U.S. Cl. .................................. 307/448; 307/450; 307/550; 307/568; 307/443; 357/23.13; 361/91
[58] Field of Search ............ 307/443, 450, 475, 296.1, 307/550, 568; 357/23.13, 23.3; 361/91, 56, 90, 111

[56] References Cited

U.S. PATENT DOCUMENTS

| | | | |
|---|---|---|---|
| 4,139,935 | 2/1979 | Bertin et al. | 357/23.13 X |
| 4,384,301 | 5/1983 | Tasch, Jr. et al. | 357/23.3 |
| 4,423,431 | 12/1983 | Sasaki | 307/304 X |
| 4,481,521 | 11/1984 | Okumura | 357/23.13 |
| 4,566,175 | 1/1986 | Smayling et al. | 357/23.3 X |
| 4,605,980 | 8/1986 | Hartranft et al. | 357/23.13 X |
| 4,692,781 | 9/1987 | Roundtree et al. | 357/23.13 |
| 4,692,834 | 9/1987 | Iwahashi et al. | 361/56 X |
| 4,703,201 | 10/1987 | McGrail | 307/290 |
| 4,739,438 | 4/1988 | Sato | 357/23.13 |
| 4,745,450 | 5/1988 | Hartranft et al. | 357/23.13 |

OTHER PUBLICATIONS

Duvvury et al., "ESD Phenomena and Protection Issues in CMOS Output Buffers," *Proceedings of the IRPS* (IEEE, 1987).
Duvvury et al., "ESD Protection Reliability in 1 μm CMOS Technologies," *Proceedings of the IRPS* (IEEE, 1986).

*Primary Examiner*—Stanley D. Miller
*Assistant Examiner*—Timothy P. Callahan
*Attorney, Agent, or Firm*—Theodore D. Lindgren; Rodney M. Anderson

[57] ABSTRACT

An output buffer having improved ESD tolerance is disclosed. The output buffer according to the invention incorporates a field oxide, or other high threshold voltage transistor, having its source-to-drain path connected between ground and the gate of the pull-down transistor, and has its gate connected to the output terminal. The threshold voltage of the high threshold device is greater than the power supply voltage, so as not to turn on during normal operation, but is lower than the $BV_{CBO}$ of the parasitic bipolar transistor associated with the pull-down transistor. The high threshold voltage device turns on with a positive voltage above its threshold appearing at the output terminal, such as occurs in an ESD event, resulting in the gate of the pull-down transistor being biased to ground. This causes the bipolar conduction, and the associated localized J-E heating, to take place away from the surface of the semiconductor, and away from the metal or silicide layers which provide the source of material for melt filaments. A similar high threshold transistor may be provided for biasing the gate of a pull-up transistor to the power supply terminal, having the same effect in the event of an ESD pulse positive relative to the power supply terminal. The high threshold transistors may be constructed as field oxide transistors, and preferably have large channel width-to-length ratios for fast switching.

14 Claims, 3 Drawing Sheets

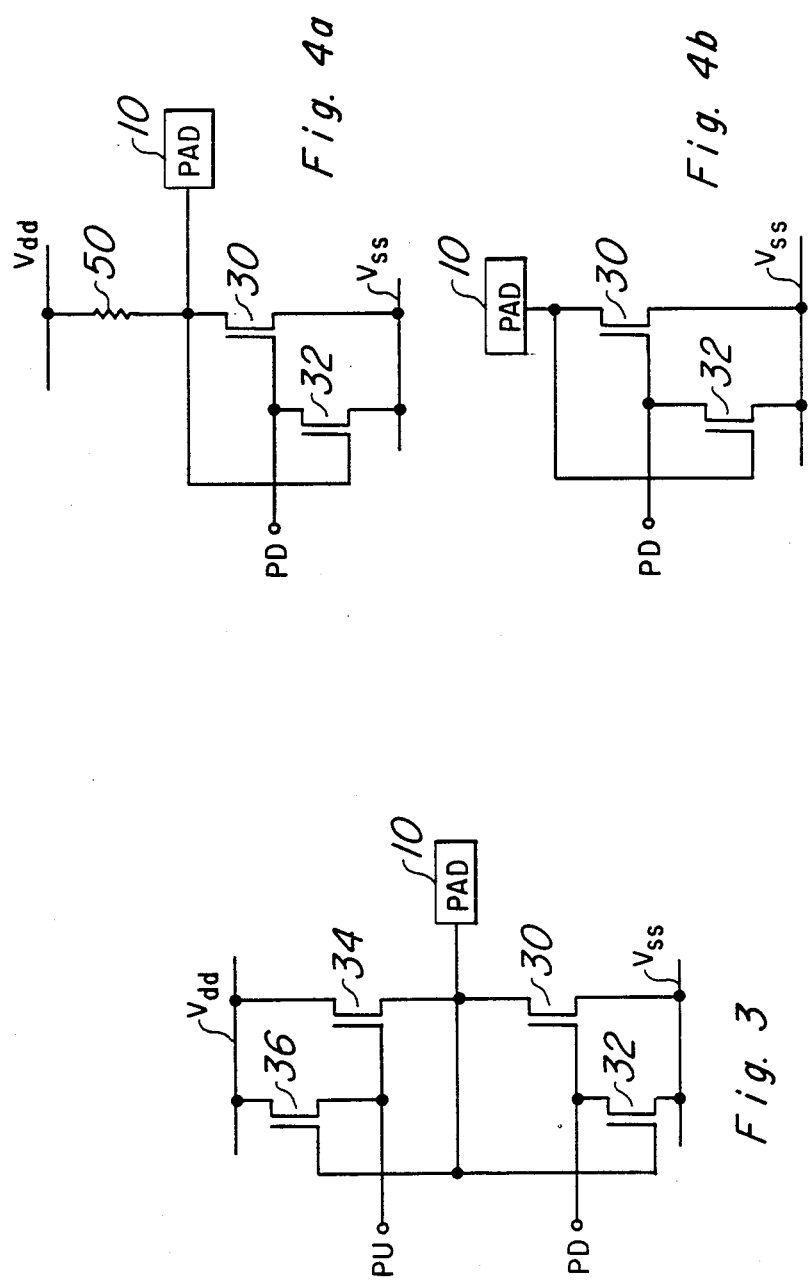

OUTPUT BUFFER WITH IMPROVED ESD PROTECTION

This invention is in the field of integrated circuits, specifically electrostatic discharge protection devices for incorporation into integrated circuits.

BACKGROUND OF THE INVENTION

A well known cause of failure for electronic integrated circuits is exposure to large and sudden electrostatic discharge. During the manufacture and use of integrated circuits, both equipment and personnel can build up substantial amounts of charge, often by triboelectric charge buildup during the contact and subsequent removal of dissimilar materials from one another. The built-up electrostatic charge can be quickly discharged when the charged item comes in contact with an integrated circuit, especially when portions of the circuit are connected to power supplies, including equipment ground. The discharge can cause significant damage to the integrated circuit by way of dielectric breakdown of oxides and other thin films, and also by high levels of conduction through relatively small areas of the circuit arising from reverse breakdown of p-n junctions on the circuit. Especially damaging results can occur if the diode enters the negative resistance region of its diode breakdown characteristics, as sufficient conduction can occur to melt conductive material such as polysilicon or aluminum, via resistive heating. The molten material can flow along the lines of the electric field to create a short circuit, such as a source-to-drain short in a MOSFET. This short circuit will remain after the electrostatic discharge has completed, and is likely to render the integrated circuit useless.

Quantification of the sensitivity of an integrated circuit to electrostatic discharge can be measured by subjecting a sample of integrated circuits to known electrostatic discharge conditions, where the amount of charge and the discharge characteristics of the charge can be controlled in a known manner. A test method is given in a standard "Test Methods and Procedures for Microelectronics", MIL-STD-883C, Method 3015.3, published by the United States Department of Defense. This method uses a "human body model" consisting of a 100 pF capacitor in series with a 1500 ohm resistor; empirical data has shown that subjecting the integrated circuit to discharge via this equivalent circuit is a good approximation for electrostatic discharge from a human being. By iteratively increasing the voltage to which the capacitor is charged prior to discharging it to a terminal of the circuit, measurement of the sensitivity threshold of a given circuit design may be made. A low failure threshold, such as 2000 volts or lower, for a circuit may require that special precautions must be taken during the handling of the circuit during its manufacture and use, adding to the production costs of both the manufacturer and the user. Of course, the number of actual electrostatic discharge failures for a particular integrated circuit will be higher for a more sensitive circuit, further adding to the costs of manufacture and use. It is clearly advantageous for both the manufacturer and the user of integrated circuits for the failure threshold to be at as high a voltage as possible.

In order to reduce the sensitivity of integrated circuits to electrostatic discharge ("ESD"), modern integrated circuits have been designed and manufactured which have protection devices at their external terminals. The intent of including such protection devices is to provide a "safe" path for the electrostatic charge to follow, such a safe path designed in such a manner that no damage occurs when electrostatic discharge occurs from a charged body to the associated terminal. These circuits have included the use of diffusion resistors and punch-through diodes. An example of such a protection device is the thick field oxide transistor described in U.S. Pat. No. 4,692,781, issued Sept. 8, 1987 and assigned to Texas Instruments Incorporated. An example of a protection device for complementary metal-oxide-semiconductor (CMOS) integrated circuits is described in copending application Ser.No. 027,103 filed Mar. 13, 1987 and assigned to Texas Instruments Incorporated.

Traditionally, output buffer circuits have not included such devices for various reasons. In integrated circuits having sufficiently large geometries, the transistors in the push-pull output buffer have been sufficiently large to safely handle fair amounts of electrostatic discharge current presented at the output terminal. The performance of the output terminal relative to electrostatic discharge protection was thus often better than the input terminals of the device. Since the electrostatic discharge protection within an integrated circuit is no better than that of its weakest terminal, little incentive existed to improve the performance of the output buffer as long as the input terminals remained weaker than the push-pull drive circuit. In addition, the attachment of protection devices to the output terminals of an integrated circuit frequently provides no protection, as the turn-on voltage of such protection devices is frequently greater than that of the output drive circuitry itself for an ESD event.

As the technology for producing integrated circuits has become more advanced, the geometries used in realizing the components within the integrated circuit have become smaller, thereby reducing the silicon cost of the circuit and increasing its operational performance. However, as the transistor sizes have become smaller, the ability of the push-pull output buffer to safely discharge electrostatic charge without damage to the circuit has reduced. In addition, the improvements to the input terminals of integrated circuits beyond the protection provided by the push-pull drive circuit has now, for some circuits, focused the emphasis of electrostatic discharge protection onto the output buffer.

In addition, some modern integrated circuits are utilizing process improvements to decrease the resistivity of diffused conductive layers. These improvements include the provision of a metal silicide layer to be formed at the top surface of diffused regions, such a layer having very low resistivity, often in conjunction with lightly-doped or graded source/drain regions. The silicide layer can be formed by the direct reaction of a sputtered or evaporated metal with the underlying diffused regions, as described in U.S. Pat. No. 4,384,301 issued on May 17, 1983 and in U.S. Pat. No. 4,545,116 issued Oct. 8, 1985, both assigned to Texas Instruments Incorporated. However, the use of lightly-doped source/drain regions and of silicide layers has been found to degrade the ESD tolerance of the circuit. Such degradation is described in "ESD Protection Reliability in 1 um CMOS Technologies", Proceedings of the IRPS (IEEE, 1986) and in "ESD Phenomena and Protection Issues in CMOS Output Buffers", Proceedings of the IRPS (IEEE, 1987). These papers discuss that the shallower diffusion depths at the channel end of the graded diffusions concentrate the conduction at the surface of the semiconductor. In addition, the silicide-clad diffusions provide a source of metal (for melt filaments) closer to the localized heating, and also likely provide, in conjunction with the graded diffusions, a greater current density-electric field product for a given magnitude of ESD stress current, further increasing the localized heating.

It is therefore an object of this invention to provide an output buffer having improved ESD tolerance.

It is a further object of this invention to provide such an output buffer which is applicable to circuits containing graded silicide-clad diffusions.

It is a further object of this invention to provide such an output buffer which may be built by existing n-channel MOS processes.

Other objects and advantages will become apparent to those of ordinary skill in the art having reference to this specification in conjunction with the drawings.

BRIEF DESCRIPTION OF THE DRAWINGS

FIG. 3 is an electrical diagram, in schematic form, of an output buffer constructed according to the invention.

FIG. 4a is an electrical diagram, in schematic form, of a resistive-load output buffer constructed according to the invention.

FIG. 4b is an electrical diagram, in schematic form, of an open-drain output buffer constructed according to the invention.

SUMMARY OF THE INVENTION

The invention may be incorporated in conventional MOS output buffer circuits by providing a high threshold voltage field effect transistor for the active output transistor. The high threshold voltage FET has its source-to-drain path connected between the power supply node to which the output transistor is connected and the gate of the output transistor. The gate of the high threshold voltage transistor is connected to the output terminal. The threshold voltage of the high threshold voltage transistor is greater than the operating voltage of the output buffer, but less than the collector-base junction breakdown voltage of the parasitic bipolar transistor. The high threshold FET may be a field oxide transistor. In a push-pull output buffer, both the pull-up and pull-down output transistors may have an associated high threshold voltage transistors, for protection against ESD events at the output terminal relative to both the ground and power supply nodes.

DETAILED DESCRIPTION OF THE PREFERRED EMBODIMENT

Figure 1:
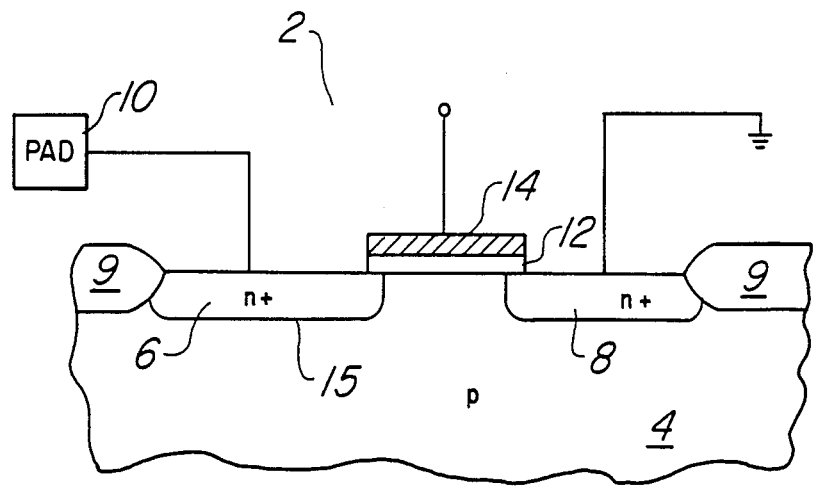
FIG. 1 is a cross-sectional diagram of an n-channel pull-down transistor constructed by conventional methods.

Referring to FIG. 1, a conventional N-channel MOS transistor 2, used as the pull-down transistor in an output buffer, is illustrated. Transistor 2 is constructed in p-type substrate 4. Substrate 4 may, of course, alternatively be formed by an epitaxial layer grown upon substrate 4, or even by a p-type well diffused into an n-type substrate or epitaxial layer, such as in a CMOS device. Drain 6 and source 8 of transistor 2 are formed by n-type diffusions into substrate 4. As is well known for a pull-down transistor, source 8 is connected to ground, and drain 6 is connected to the output terminal at pad 10. Field oxide layers 9 isolate the n-type diffusions of transistor 2 from neighboring transistors, in a manner well known in the art. The channel region lying between source 8 and drain 6 is covered by gate dielectric 12, over which gate terminal 14 is deposited and patterned. Gate dielectric 12 is generally silicon dioxide, while gate terminal 14 is generally polycrystalline silicon. As is also well known in the art, drain 6 and source 8 regions are diffused after gate dielectric 12 and gate electrode 14 are in place, for self-alignment with gate electrode 14. The metallization forming contacts to gate electrode 14, drain region 6 and source region 8 is not shown in FIG. 1 for the sake of simplicity.

In the event of a substantial voltage pulse on pad 10 of negative potential relative to ground, such as may occur in an ESD event, transistor 2 is able to quickly handle the resultant current. Since substrate 4 is generally biased to ground, or to a negative voltage, a negative voltage or drain 6 will forward bias p-n junction 15 between drain 6 and substrate 4. Accordingly, the charge applied to pad 10 by the negative ESD event is safely conducted into substrate 4, without damage to transistor 2.

For a pulse on pad 10 of positive potential relative to ground, however, p-n junction 15 between drain 6 and substrate 4 is reverse biased. A parasitic n-p-n bipolar transistor exists in this structure, consisting of drain 6 as its collector, substrate 4 as its base, and source 8 as its emitter. If the pulse is of sufficient magnitude, as can occur in an ESD event, junction 15 will break down. This breakdown will result in a current injected into substrate 4 at junction 15, which provides sufficient base current for the parasitic n-p-n bipolar transistor to turn it on. If the voltage of pad 10 resulting from the ESD event is sufficiently large to exceed the $BV_{CBO}$ of this parasitic transistor, the resultant breakdown current would be conducted from pad 10 to source region 8, connected to ground. In breakdown, damage to transistor 2 can result from localized heating due to this conduction, such localized heating determined by the product of the local current density and the electric field (J-E product). The J-E product is likely to be locally highest at junction 15 in breakdown. As discussed in the above-referenced paper "ESD Protection Reliability in 1um CMOS Technologies", the likelihood of damage to transistor 2 due to this condition will depend in large degree upon the spacing between the metal contact to drain 6 and the gate electrode 14, separating the metallization (i.e., the source of melt filaments) from the point of localized heating at junction 15.

Figure 2:
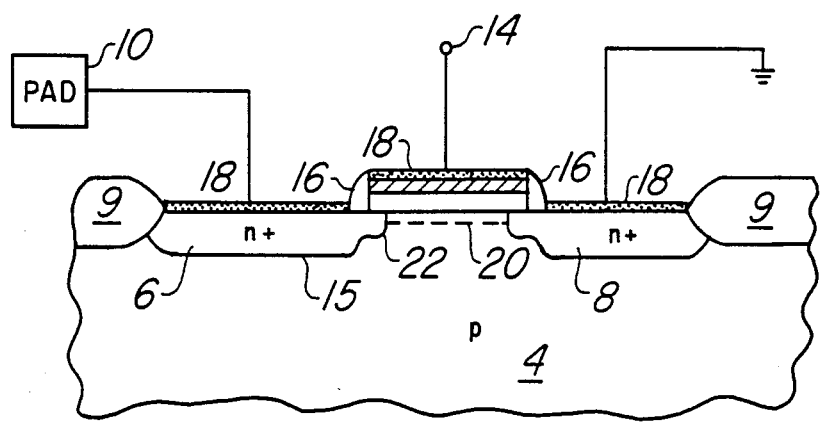
FIG. 2 is a cross-sectional diagram of an n-channel pull-down transistor having clad diffusions constructed by conventional methods, illustrating channel inversion resulting from capacitive coupling of an ESD pulse to the gate.

Referring now to FIG. 2, the construction of transistor 2 using the lightly-doped-drain, or graded junction, construction and using silicide-clad diffusions, is illustrated. As is described in U.S. Pat. No. 4,566,175, issued Jan. 28, 1986 and assigned to Texas Instruments Incorporated, sidewall oxide spacers 16 may be formed along the edges of gate dielectric 12 and gate electrode 14, resulting in a shallower junction depth of drain regions 6 and source regions 8 near the transistor channel region, as shown in FIG. 2. In addition, it is also well known in the art to clad the exposed silicon in drain region 6, source region 8, and gate electrode 14 with a silicide 18 such as titanium silicide. Such titanium silicide formation is accomplished by way of a direct react process after deposition of a titanium layer, as is well known in the art and as described in the above-referenced U.S. Pat. Nos. 4,384,301 and 4,545,116. As described in the above referenced papers "ESD Protection Reliability in 1um CMOS Technologies" and "ESD Phenomena and Protection Issues in CMOS Output Buffers", the use of these advanced process techniques result in reduced failure thresholds to ESD events. It is believed that the factors of greater localized heating due to the increase in the J-E product at the surface of the channel region resulted from the shallower junction depth of the graded junction, and greater availability of melt material from silicide layer 18 closer to the localized heating, contribute to reduced failure thresholds for these technologies.

In addition, some amount of capacitive coupling between drain region 6 and gate electrode 14 occurs in a positive polarity ESD pulse. This coupling of a positive voltage (relative to substrate 4 and ground) onto gate electrode 14 will tend to invert the channel region under gate dielectric 21; such an inversion layer 20 is illustrated in FIG. 2. Therefore, in addition to the conduction resulting from breakdown of junction 15 and the resultant bipolar conduction as described above, some MOS conduction may also occur through transistor 2. The combination of the concentration of bipolar conduction and MOS conduction at the surface of transistor 2 increases the localized J-E product at point 22, close to silicide layer 18. The likelihood of failure for an ESD event of a given magnitude is therefore significantly increased due to the use of silicide layer 18 and the graded junction.

In order to increase the failure threshold, transistor 2 of FIG. 2 must conduct the current provided by the ESD event at pad 10 in a direction which minimizes the localized J-E product near silicide layer 18. The embodiment of the invention described herein controls the direction of the ESD current by holding the potential of gate electrode 14 at ground, hindering the formation of inversion layer 20 thereunder. This grounding of gate electrode 14 also tends to force the breakdown current for the parasitic bipolar transistor away from the surface, into the bulk of substrate 4. With the conduction path steered away from the surface of the channel region, the J-E product at the surface of the channel region at point 22 near silicide layer 18 will be reduced, and the tolerance of transistor 2 to a positive polarity ESD event will be increased.

Referring now to FIG. 3, an n-channel MOS push-pull output buffer circuit constructed according to the invention is illustrated. This circuit biases the gates of both the pull-up and pull-down transistors to hold them off during a positive polarity ESD event, but otherwise functions normally. Pull-down transistor 30 is an n-channel transistor, constructed as transistor 2 in FIGS. 1 or 2, having its source connected to $V_{ss}$ (ground), and its drain connected to pad 10. Pull-up transistor 34 also is a similarly constructed n-channel transistor, having its drain connected to positive power supply voltage $V_{dd}$ and its source connected to pad 10. The gate of transistor 30 is controlled, for functional purposes, by a signal applied to node PD; similarly the gate of transistor 34 is controlled by a signal applied to node PU. The signals at nodes PU and PD are generally logical complements of one another so that, depending on the logic state to be presented at pad 10, either transistor 34 or transistor 30 (but not both) will be conducting. As is well known in the art, a delay will often be generated between high levels at nodes PU and PD, so that transistors 30 and 34 will both be turned off for a time during the switching of the output pad 10 from one state to another, reducing the power dissipation of the circuit. Node PU may be bootstrapped to a level above the power supply voltage $V_{dd}$, in a well-known manner, so that pad 10 may be drive fully to $V_{dd}$ and present a full "1" logic state at the output.

According to this embodiment of the invention, transistor 32 is provided in the circuit. Transistor 32 is an n-channel transistor which is constructed to have a threshold voltage higher than the power supply voltage $V_{dd}$ but below the $BV_{CBO}$ of the parasitic n-p-n bipolar transistor provided by transistor 30, as described above. This higher threshold voltage for transistor 32 may be accomplished by way of numerous well-known techniques. A preferred construction of transistor 32 is a field oxide transistor as described hereinbelow. For modern devices, with field oxide and multilevel thicknesses of 5000 Angstroms, the threshold voltage of transistor 32, having a metal gate and with typical channel-stop implant may be in the range of 12 to 15 volts. The source of transistor 32 is connected to $V_{ss}$, its drain is connected to the gate of transistor 30, and its gate is connected to pad 10.

In the event of a positive polarity ESD event at pad 10 relative to $V_{ss}$, such an event inducing a voltage at pad 10 above the threshold voltage of transistor 32, transistor 32 will turn on. Transistor 32 thus connects the gate of pull-down transistor 30 to $V_{ss}$. As described above, this will prevent MOS conduction of transistor 30 during the ESD event, and will also force the current induced by the positive ESD event into substrate 4, away from the surface of the channel region 30. This will increase the ability of transistor 30 to safely conduct the ESD-applied charge to pad 10, especially if transistor 30 is formed as shown in FIG. 2 with graded junctions and silicide layer 18.

It is important that transistor 32 conduct quickly in the event of a positive polarity ESD event, prior to the parasitic bipolar transistor going into second breakdown. Accordingly, it is preferable that the width-to-length ratio of transistor 32 be as large as practicable. This can be achieved, for a field oxide transistor 32, by making its channel length at the minimum isolation geometry (for example, a 1 micron), and by having its width as large as practically allowable from an area standpoint (for example, in the range of 100 to 500 microns).

In normal operation, it is seen that pad 10 may be pulled high, to $V_{dd}$, when node PU is high (bootstrapped above $V_{dd}$) and node PD is low. Since the threshold voltage of transistor 32 is greater than the bootstrapped level of line PU, transistor 32 will not conduct with transistor 34 on and will have no effect on the circuit. If fabricated as a field oxide device, the capacitive load of transistor 32 is relatively small.

It should of course be noted that the incorporation of transistor 32 with pull-down transistor 30 is useful for protection of ESD events relative to ground for many types of output buffers, including CMOS output buffers using a p-channel pull-up transistor, regardless of the realization of the pull-up side of the output buffer. FIG. 4a illustrates the incorporation of transistor 32 in an output buffer having a resistive load 50 connected between pad 10 at the drain of transistor 30, and $V_{dd}$. FIG.

4b illustrates the incorporation of transistor 32 into an open-drain configuration output buffer. However, if an n-channel pull-up transistor 34 is used as shown in FIG. 3, further ESD tolerance may be achieved by use of another high-threshold n-channel transistor 36.

N-channel transistor 36 has its source connected to the gate of transistor 34, its drain connected to $V_{dd}$, and its gate connected to pad 10. Similarly as transistor 32, transistor 36 has a high threshold voltage, above $V_{dd}$ and below the $BV_{CBO}$ of the parasitic n-p-n transistor associated with transistor 34. In the event of a positive polarity ESD event relative to $V_{dd}$, transistor 36 will conduct and bias the gate of transistor 34 to $V_{dd}$. Since the source of transistor 34 is at a voltage above $V_{dd}$, being connected to pad 10, transistor 34 is held off in a similar fashion as transistor 30 in the case of the ESD pulse relative to $V_{ss}$. In addition to the threshold voltage of transistor 36 being lower than the $BV_{CBO}$ of the parasitic bipolar transistor, it is again preferable that transistor 36 be constructed with a high width-to-length ratio (i.e., in the hundreds), so that it can bias the gate of transistor 34 to $V_{dd}$ prior to the breakdown of the parasitic n-p-n transistor. Similarly as transistor 32, in normal operation the threshold voltage of transistor 36 greater than $V_{dd}$, keeps transistor 36 from conducting. The worst case for conduction of transistor 36 in normal operation is shortly after node PU falls from a high to a low voltage, during the discharge of pad 10 from $V_{dd}$.

Figure 5:
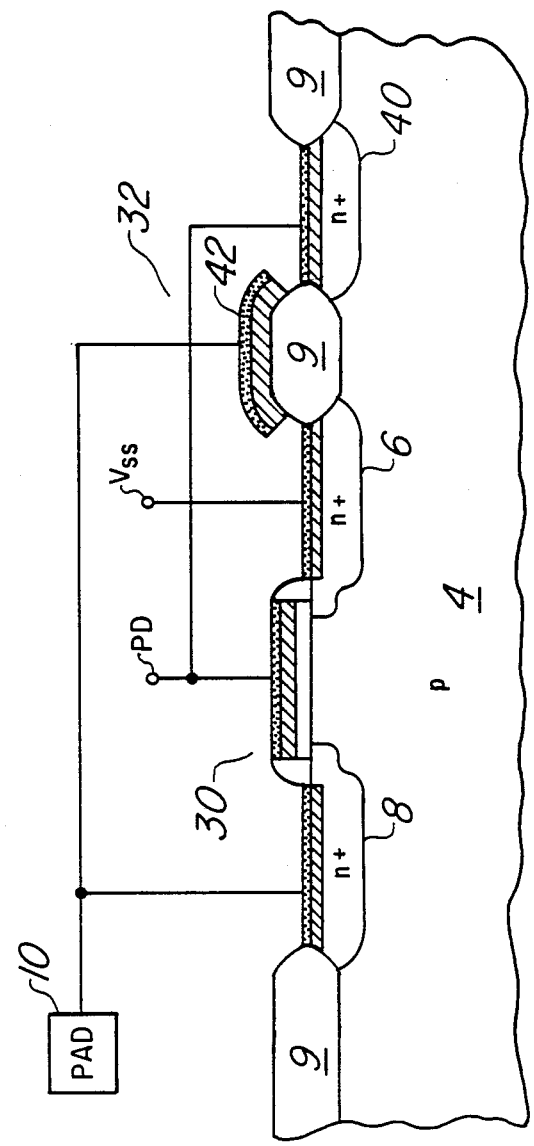
FIG. 5 is a cross-sectional diagram of an output buffer transistor and its associated field oxide transistor incorporated in the output buffer of FIG. 3.

Referring now to FIG. 5, the construction of transistor 32 as a field oxide transistor is illustrated, in conjunction with transistor 30. The transistors of FIG. 5 are shown as constructed with the graded junction and silicide layer 18 as shown in FIG. 2. It should be noted that transistors 30 and 32 could, of course, be constructed as shown in FIG. 1, with abrupt junctions and unclad diffusions but, as explained above, the impact of the high threshold voltage transistors on ESD tolerance will be greater for transistors constructed with graded junctions and clad diffusions.

Transistor 30 of FIG. 5 is constructed similarly as transistor 2 of FIG. 2, with like elements referred to by like reference numerals. Field oxide transistor 32 is constructed using field oxide 9 as the gate dielectric, and with source region 8 as its source. As illustrated in FIG. 3, source 8 of transistors 30 and 32 is biased to $V_{ss}$. Drain 40 of transistor 32 is an n-type diffusion into substrate 4, and gate electrode 42 of transistor 32 overlays the field oxide 9 lying between source region 8 and drain 40. Gate electrode 42 is shown as a silicide-clad layer of polysilicon; of course, any known material for transistor gate electrodes. Including aluminum and other metallization layers, may alternatively be used as the gate electrode for transistor 32. Drain 40 is connected (by way of metallization or the like, not shown in FIG. 5 for purposes of clarity) to the gate of transistor 30, as shown in FIG. 3. Gate electrode 42 is connected to pad 10, also as shown in FIG. 3. It should be noted that the construction of transistors 34 and 36 is identical to that shown in FIG. 5, replacing the $V_{ss}$ connection with $V_{dd}$.

Although the invention has been described with reference to an illustrative embodiment, it is to be understood that this description is by way of example only, and is not intended to be construed in a limiting sense. It is to be further understood that numerous changes in the details of the illustrative embodiment, and additional embodiments of the invention, will be apparent to, and may be made by, persons skilled in the art having reference to this description. In addition, it is to be further understood that those skilled in the art may readily substitute present and future equivalent components for those described herein, in order to achieve the same result as the illustrative embodiment. It is contemplated that such changes, substitutions and additional embodiments are within the spirit and scope of the invention as hereinafter claimed.

We claim:

1. An output buffer for an integrated circuit having a power supply voltage, comprising:
   a first drive transistor, having its source-to-drain path connected between an output terminal and a reference supply node, and having a gate for receiving an input signal; and
   a first high threshold transistor, having a threshold voltage greater than the power supply voltage of said integrated circuit, having its source-to-drain path connected between the gate of said first drive transistor and said reference supply node, and having its gate connected to said output terminal.

2. The output buffer of claim 1, wherein said first high threshold transistor comprises a field oxide transistor.

3. The output buffer of claim 2, wherein the width-to-length ratio of said field oxide transistor is greater than 100.

4. The output buffer of claim 1, further comprising:
   pull-up means, connected between a power supply node and said output terminal.

5. The output buffer of claim 4, wherein said pull-up means comprises a resistor.

6. The output buffer of claim 4, wherein said pull-up means comprises:
   a second drive transistor, having its source-to-drain path connected between said output terminal and said power supply node, and having a gate for receiving an input signal, so that said second drive transistor is off when said first drive transistor is on, and so that said first drive transistor is off when said second drive transistor is on.

7. The output buffer of claim 6, further comprising:
   a second high threshold transistor, having a threshold voltage greater than the power supply voltage of said integrated circuit, having its source-to-drain path connected between the gate of said second drive transistor and said power supply node, and having its gate connected to said output terminal.

8. An output buffer for an integrated circuit formed in a semiconductor body and having a power supply voltage, comprising:
   a first drive transistor, having a source and a drain each formed by a silicide-clad diffusion into a face of said semiconductor body, said source connected to a reference supply node, and said drain connected to an output terminal, said first drive transistor having a gate for receiving an input signal; and
   a first high threshold transistor, having a threshold voltage greater than the power supply voltage of said integrated circuit, having its source-to-drain path connected between the gate of said first drive transistor and said reference supply node, and having its gate connected to said output terminal.

9. The output buffer of claim 8, wherein said first high threshold transistor comprises:
   a silicide-clad drain diffusion into said face of said semiconductor body;

a channel region lying between said drain diffusion of said first high threshold transistor and the source region of said first drive transistor;

a field oxide layer overlying said channel region; and a gate electrode, overlying said channel region, said gate electrode connected to said output terminal.

10. The output buffer of claim 9, wherein the width-to-length ratio of said channel region of said first high threshold transistor is greater than 100.

11. The output buffer of claim 8, further comprising:
pull-up means, connected between a power supply node and said output terminal.

12. The output buffer of claim 11, wherein said pull-up means comprises:

a second drive transistor, having a source and a drain each formed by a silicide-clad diffusion into said face of said semiconductor body, said drain connected to a power supply node, and said source connected to said output terminal, said second drive transistor having a gate for receiving an input signal so that said second drive transistor is off while said first drive transistor is on, and so that said first drive transistor is off while said second drive transistor is on.

13. The output buffer of claim 12, further comprising:
a first high threshold transistor, having a threshold voltage greater than the power supply voltage of said integrated circuit, having its source-to-drain path connected between the gate of said first drive transistor and said reference supply node, and having its gate connected to said output terminal.

14. The output buffer of claim 13, wherein said second high threshold transistor comprises:

a silicide-clad drain diffusion into said face of said semiconductor body;

a channel region lying between said drain diffusion of said second high threshold transistor and the source region of said second drive transistor;

a field oxide layer overlying said channel region; and a gate electrode, overlying said channel region, said gate electrode connected to said output terminal.

* * * * *